(12) United States Patent
Aritomi et al.

(10) Patent No.: US 6,477,105 B2
(45) Date of Patent: Nov. 5, 2002

(54) SEMICONDUCTOR MEMORY DEVICE WITH A HIERARCHICAL WORD LINE CONFIGURATION CAPABLE OF PREVENTING LEAKAGE CURRENT IN A SUB-WORD LINE DRIVER

(75) Inventors: Kengo Aritomi; Mikio Asakura; Takashi Ito; Kiyohiro Furutani, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/103,698

(22) Filed: Mar. 25, 2002

(65) Prior Publication Data

US 2002/0097630 A1 Jul. 25, 2002

Related U.S. Application Data

(62) Division of application No. 09/566,488, filed on May 8, 2000.

(30) Foreign Application Priority Data

Oct. 25, 1999 (JP) ..................................... 11-302342 (P)

(51) Int. Cl.$^7$ ................................................. G11C 8/00
(52) U.S. Cl. .............................................. 365/230.03
(58) Field of Search ......................... 365/230.06, 230.03

(56) References Cited

U.S. PATENT DOCUMENTS

| 5,513,146 A | 4/1996 | Atsumi et al. .......... 365/185.23 |
| 5,831,924 A | 11/1998 | Nitta et al. ............. 365/230.03 |
| 6,088,286 A | * 7/2000 | Yamauchi et al. ...... 365/230.06 |

FOREIGN PATENT DOCUMENTS

| JP | 59-104792 | * 6/1984 | ............ G11C/11/34 |
| JP | 59-124092 | * 7/1984 | ............ G11C/11/34 |
| JP | 10-275469 | 10/1998 | |

* cited by examiner

Primary Examiner—M. Tran
(74) Attorney, Agent, or Firm—McDermott, Will & Emery (57) ABSTRACT

Complementary sub-decode signals to be provided to a sub-word line driver are separately generated through different circuits using individual power-supply voltages. Thus, the generation of a through current in the sub-word line driver is prevented.

11 Claims, 9 Drawing Sheets

PROCESSING OF SDF/ZSDF → SD/ZSD MAY BE PERFORMED IN SDB1 TO SDBk+1

SEMICONDUCTOR MEMORY DEVICE WITH A HIERARCHICAL WORD LINE CONFIGURATION CAPABLE OF PREVENTING LEAKAGE CURRENT IN A SUB-WORD LINE DRIVER

This application is a divisional of application Ser. No. 09/566,488 filed May 8, 2000.

BACKGROUND OF THE INVENTION

1. Field of the Invention

The present invention relates to a semiconductor memory device, and particularly to a semiconductor memory device having a divided word line structure in which word lines are divided into main word lines and sub-word lines. More specifically, the present invention relates to an arrangement for driving a sub-word line to a selected state.

2. Description of the Background Art

Figure 11:
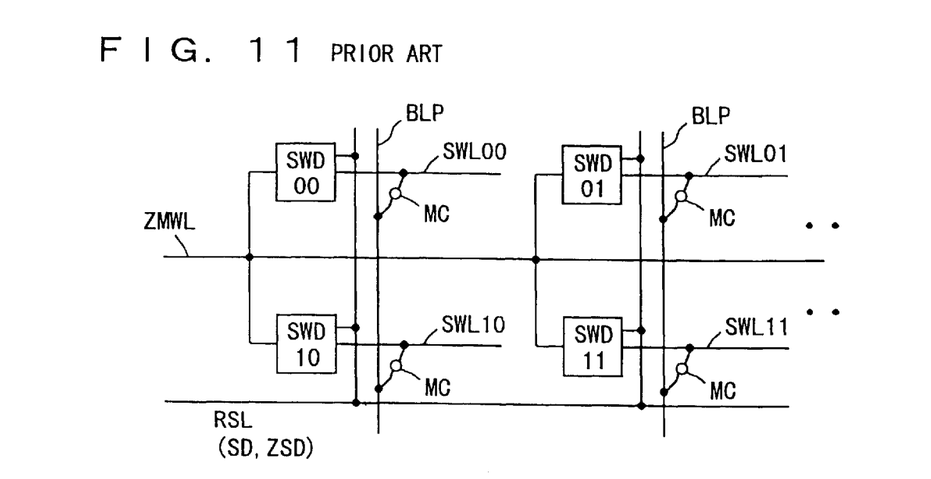
FIG. 11 is a schematic representation of an arrangement of a conventional divided word line structure.

FIG. 11 is a schematic representation of a configuration of an array portion of a conventional semiconductor memory device. In FIG. 11, memory cells MC are arranged in a matrix of rows and columns. A sub-word line is provided correspondingly to each row of memory cells MC. Sub-word lines SWL00, SWL01, SWL10, SWL11 are shown in FIG. 11. Memory cells MC are divided into blocks along the row direction, and sub-word lines SWL are arranged in the respective blocks. A main word line ZMWL is provided in common to these sub-word lines. Sub-word line drivers SWD00, SWD01, SWD10, SWD11 are provided to sub-word lines SWL00, SWL01, SWL10, SWL11, respectively. Each of these sub-word line drivers SWD00, SWD01, SWD10, SWD11 drives a corresponding sub-word line to the selected state according to the signal potential on main word line ZMWL and a row select signal RSL. Row select signal RSL includes complementary signals SD and ZSD, and designates a sub-word line in a set of sub-word lines aligned in the column direction. Thus, row select signal RSL (sub-decode signals SD and ZSD) designates one of sub-word lines SWL00 and SWL10, and one of sub-word lines SWL01 and SWL11.

By providing one main word line ZMWL to a plurality of rows of memory cells, the pitch condition of main word line ZMWL is mitigated. Only the sub-word line drivers are connected to main word line ZMWL, and memory cells MC are not connected to main word line ZMWL. Thus, the load (impedance) on main word line ZMWL can be reduced, and the word line can be driven to the selected state at a high speed. Such an arrangement in which word lines are divided into main word lines ZMWL and sub-word lines SWL (generically indicating sub-word lines SWL00, SWL01, SWL10, SWL11) is referred to as a divided word line structure.

Moreover, a bit line pair BLP is shown in FIG. 11. Bit line pair BLP includes complementary bit lines BL and /BL, and a memory cell MC is connected to one of bit lines BL and /BL.

Figure 12:
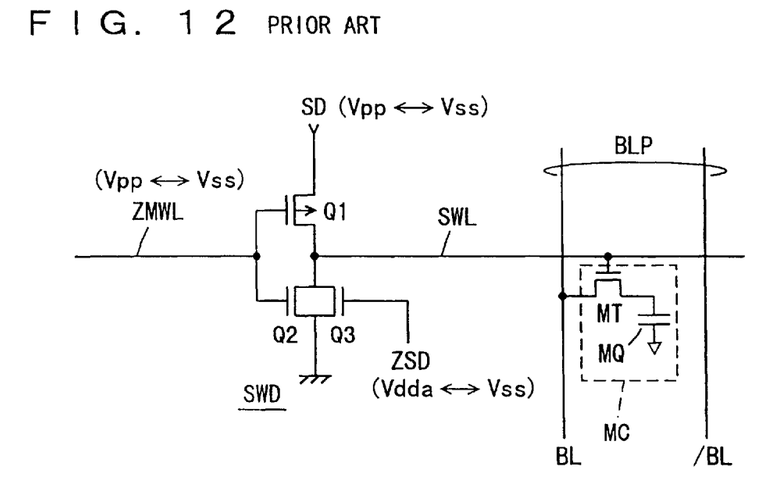
FIG. 12 is a diagram representing a configuration of a sub-word line driver shown in FIG. 11.

FIG. 12 is a diagram representing a configuration of sub-word line driver SWD shown in FIG. 11. Referring to FIG. 12, sub-word line driver SWD includes a P-channel MOS transistor Q1 that is rendered conductive, when the signal potential on main word line ZMWL is at a ground voltage Vss level, to transmit a sub-decode signal SD onto sub-word line SWL, an N-channel MOS transistor Q2 that is rendered conductive, when the signal potential on main word line ZMWL is at a high voltage Vpp, to drive sub-word line SWL to ground voltage Vss level, and an N-channel MOS transistor Q3 that is rendered conductive, when sub-decode signal ZSD is at an array power-supply voltage Vdda level, to drive sub-word line SWL to ground voltage Vss level.

Sub-decode signal SD changes between high voltage Vpp and ground voltage Vss, and sub-decode signal ZSD changes between array power-supply voltage Vdda and ground voltage Vss. High voltage Vpp is transmitted to sub-word line SWL by sub-decode signal SD for the reason given below.

As shown in FIG. 12, a memory cell MC includes a memory capacitor MQ for storing information, and an access transistor MT rendered conductive in response to the signal potential on sub-word line SWL to connect memory capacitor MQ to bit line BL (or /BL). Access transistor MT is formed by an N-channel MOS transistor. Therefore, when writing into memory capacitor MQ logic high or "H" level (array power-supply voltage Vdda level) data, there is a need to prevent the voltage level of the "H" level data of memory capacitor MQ from being lowered by threshold voltage loss in access transistor MT. In order to compensate for the threshold voltage loss, high voltage Vpp higher than array power-supply voltage Vdda is transmitted on sub-word line SWL. In order to reliably set P-channel MOS transistor Q1 to the off state, that main word line ZMWL is driven to high voltage Vpp level.

With the arrangement of sub-word line driver SWD shown in FIG. 12, MOS transistor Q1 attains the off state while MOS transistor Q2 attains the on state when main word line ZMWL is at high voltage Vpp level so that MOS transistor Q2 drives sub-word line SWL to ground voltage Vss level regardless of the logic levels of sub-decode signals SD and ZSD. When main word line ZMWL is at high voltage Vpp level of the non-selected state, sub-word line SWL also is held at ground voltage Vss level of the non-selected state.

On the other hand, when main word line ZMWL is driven to ground voltage Vss level of the selected state, MOS transistor Q1 attains either the off or on state while MOS transistor Q2 attains the off state. When sub-decode signal SD is at high voltage Vpp level, MOS transistor Q1 attains the on state so that the sub-decode signal of high voltage Vpp level is transmitted on sub-word line SWL. When sub-decode signal SD is at ground voltage Vss level of the non-selected state, MOS transistor Q1 attains the off state, with its gate and its source being at the same voltage level. In this state, both MOS transistors Q1 and Q2 attain the off state. Sub-decode signal ZSD at this time is at array power-supply voltage Vdda level, and MOS transistor Q3 attains the on state, driving sub-word line SWL to ground voltage Vss level. Thus, the use of complementary sub-decode signals SD and ZSD prevents sub-word line SWL from electrically floating.

Figure 13:
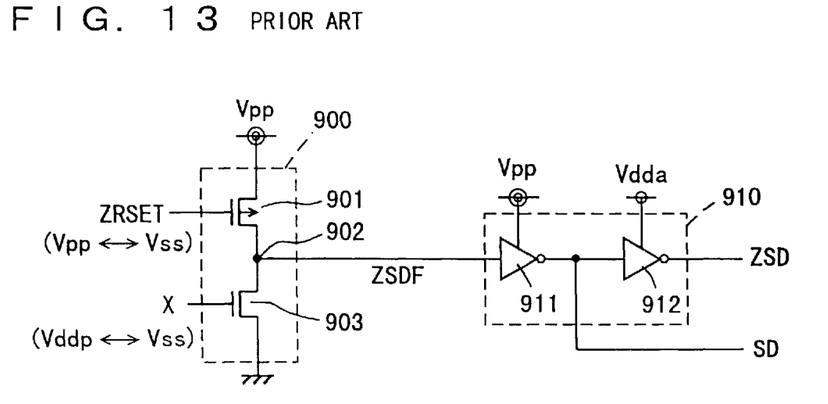
FIG. 13 is a diagram representing a configuration of a conventional sub-decode desigal generating circuit.

FIG. 13 is a diagram representing a configuration of a conventional sub-decode signal generating portion. In FIG. 13, the sub-decode signal generating portion includes a sub-decoder 900 for generating a sub-decode fast signal ZSDF according to a predecode signal X, and a sub-decode signal generating circuit 910 for generating complementary sub-decode signals (word line designating signal) from sub-decode fast signal ZSDF.

Sub-decoder 900 includes a P-channel MOS transistor 901 connected between a high voltage node receiving a high voltage Vpp and a node 902 and receiving a reset signal ZRSET at a gate thereof, and an N-channel MOS transistor 903 connected between node 902 and a ground node and receiving predecode signal X at a gate thereof. Reset signal ZRSET changes between high voltage Vpp and ground voltage Vss. Predecode signal X changes between peripheral power-supply voltage Vddp and ground voltage Vss.

Sub-decode signal generating circuit 910 includes an inverter 911 for receiving sub-decode fast signal ZSDF to generate sub-decode signal SD, and an inverter 912 for receiving an output signal from inverter 911 to generate a complementary sub-decode signal ZSD. Inverter 911 receives high voltage Vpp as one operating power-supply voltage, while inverter 912 receives array power-supply voltage Vdda as one operating power-supply voltage. Therefore, sub-decode signal SD has an amplitude of high voltage Vpp, and the complementary sub-decode signal ZSD has an amplitude of array power-supply voltage Vdda. Now, the operation of the sub-decode signal generating portion shown in FIG. 13 will be described.

At a standby state, reset signal ZRSET is at ground voltage Vss level and predecode signal X is also at ground voltage Vss level. Therefore, node 902 is charged to high voltage Vpp level by MOS transistor 901 in the on state.

Sub-decode signal SD attains the ground voltage level of the logic low or "L" level, and the complementary sub-decode signal ZSD attains array power-supply voltage Vdda level of the logic high or "H" level. Thus, in sub-word line driver SWD shown in FIG. 12, MOS transistor Q3 is in the on state (and main word line ZMWL is at high voltage Vpp level), and sub-word line SWL is maintained at the ground voltage level.

When an active cycle for selecting a memory cell starts, reset signal ZRSET attains high voltage Vpp level and MOS transistor 901 attains the off state. Predecode signal X, in the selected state, attains peripheral power-supply voltage Vddp level of the "H" level, and sub-decode fast signal SDF from node 902 is driven to ground voltage Vss level by MOS transistor 903. Accordingly, sub-decode signal SD attains high voltage Vpp level, and the complementary sub-decode signal ZSD attains ground voltage Vss level. Two stages of cascaded inverters 911 and 912 are utilized to generate from sub-decode fast signal ZSDF, sub-decode signals SD and ZSD that are complementary to one another and have different amplitudes, so that the circuit area can be reduced. Moreover, by setting the amplitude of the complementary sub-decode signal ZSD to array power-supply voltage Vdda level, the lower power consumption can be achieved than the case where high voltage Vpp is used. Further, array power-supply voltage Vdda can stabilize the voltage level of the complementary sub-decode signal ZSD.

Figure 14:
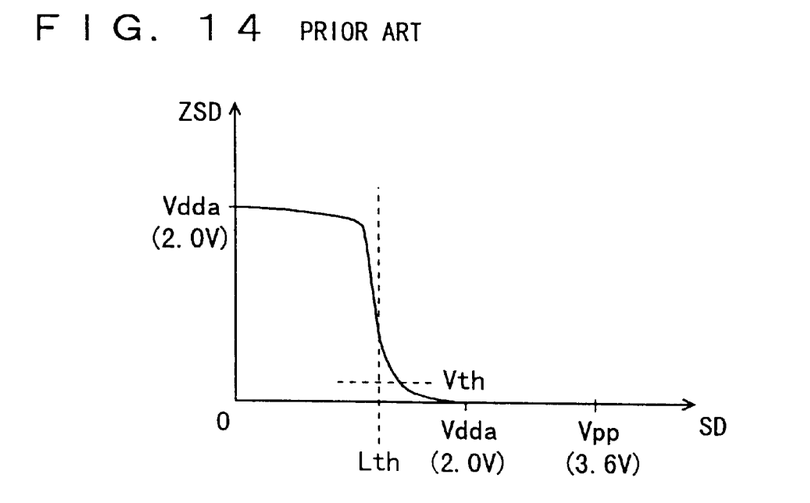
FIG. 14 is a schematic representation of the input and output characteristics of an inverter for generating a complementary sub-decode signal shown in FIG. 13.

FIG. 14 is a schematic representation of the input and output characteristics of inverter 912 shown in FIG. 13. In FIG. 14, an input signal SD is indicated on the horizontal axis and an output signal ZSD is indicated on the vertical axis. High voltage Vpp is at 3.6V, for instance, and array power-supply voltage Vdda is at 2.0V, for instance. An input logic threshold voltage Lth of inverter 912 is set at a relatively high value, since the amplitude of input signal (sub-decode signal) SD is high voltage Vpp and is greater than the amplitude of output signal ZSD of inverter 912. This is done to equalize the rise time and the fall time of the complementary sub-decode signal ZSD upon the change of the input signal of inverter 912.

Figure 15:
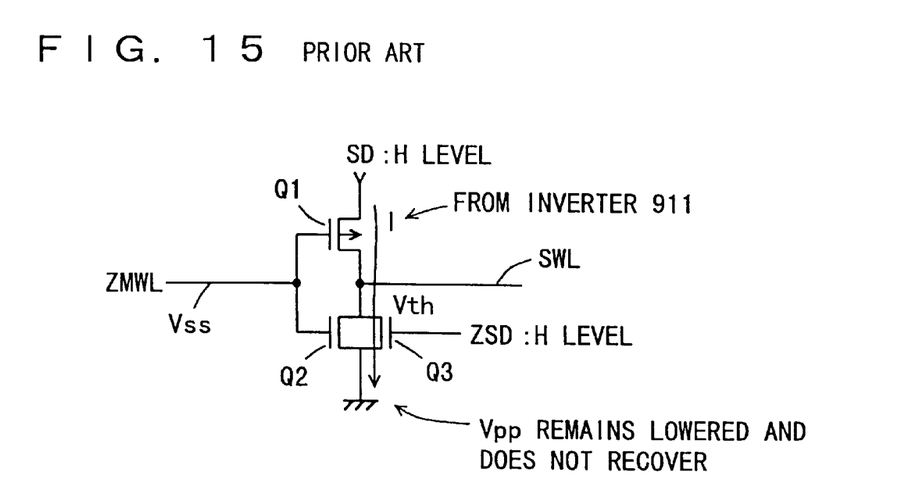
FIG. 15 is a diagram related to a description of problems of a conventional semiconductor memory device.

High voltage Vpp is consumed in the sub-decode signal generating circuit for generating a sub-decode signal and in a main word line drive circuit (not shown) for driving a main word line. During the operation of selecting a word line, if the voltage level of high voltage Vpp falls and nears input logic threshold voltage Lth of inverter 912, the voltage level of the complementary sub-decode signal ZSD from inverter 912 rises. When the voltage level of the complementary sub-decode signal ZSD from inverter 912 rises and becomes higher than a threshold voltage Vth of MOS transistor Q3 in sub-word line driver SWD as shown in FIG. 15, MOS transistor Q3 is rendered conductive.

When main word line ZMWL is in the selected state of ground voltage Vss level, if sub-decode signal SD is at the "H" level, its complementary sub-decode signal ZSD also attains the high level. MOS transistors Q1 and Q3 are rendered conductive, causing a through current to flow through MOS transistors Q1 and Q3, which leads to an increase in the consumed current. In addition, high voltage Vpp is consumed due to this through current during a normal operation mode, and when the voltage level of high voltage Vpp is lowered, the voltage level of the selected sub-word line SWL is lowered as well, which creates the possibility that the "H" level data of a sufficient voltage level may not be written into a memory cell.

In particular, in a test mode such as a wafer burn-in test, all word lines (sub-word lines), or half the word lines (sub-word lines) with odd number addresses or even number addresses are selected at once. When such a plurality of word lines (sub-word lines) are selected at the same time and more word lines (sub-word lines) than those selected in the normal operation mode are selected, more supplied charges from a high voltage generating circuit are consumed, and the degree of fall in high voltage Vpp becomes greater (since the number of selected sub-word lines increases and the number of the paths of through currents increases). If all of or more than the supplied charges from the high voltage generating circuit are consumed upon such fall in high voltage Vpp level, the voltage level of high voltage Vpp would retain the lowered state, and consequently, a high voltage of the intended level cannot be applied to the selected word lines (main and sub-word lines), the voltage stress acceleration cannot be performed with accuracy, and the reliability of the products (chips) cannot be ensured even with a burn-in test.

SUMMARY OF THE INVENTION

An object of the present invention is to provide a semiconductor memory device in which no through current is generated even when the voltage level of high voltage Vpp becomes low r.

Another object of the present invention is to provide a semiconductor memory device that can reliably maintain the complementary sub-decode signal in the non-selected state even when the voltage level of high voltage Vpp becomes lower.

A further object of the present invention is to provide a semiconductor memory device that allows an accurate voltage application in a voltage stress acceleration test such as a burn-in test.

Briefly, the semiconductor memory device according to the present invention generates a complementary sub-decode signal in different circuitry from a circuit utilizing a high voltage. In other words, the complementary sub-decode signals are produced via separate paths.

By generating complementary sub-decode signals via separate paths, the logic voltage levels of the complementary sub-word line select signals can be prevented from affecting one another, and the complementary sub-word line select signals (sub-decode signals) can be reliably fixed to voltages of different logic levels.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
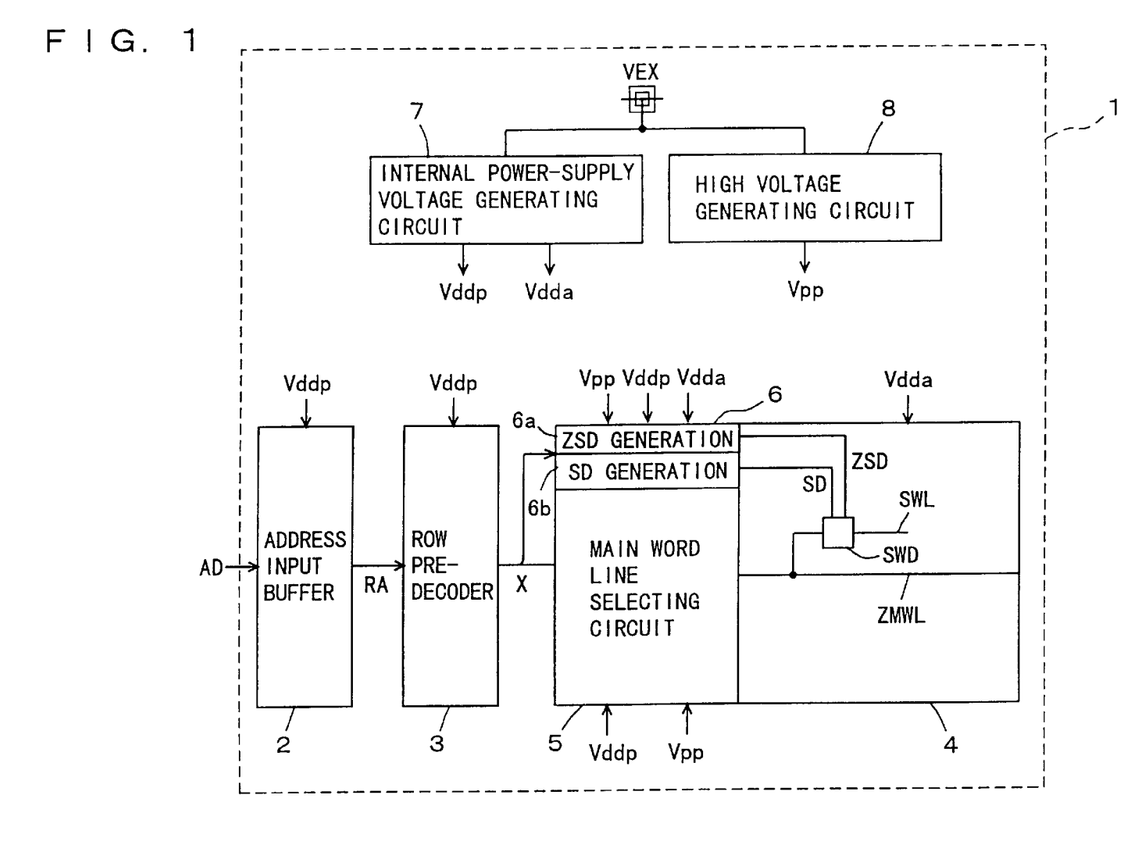
FIG. 1 is a schematic representation of an overall configuration of a semiconductor memory device according to the present invention.

FIG. 1 is a schematic representation of a configuration of a portion related to row select operation of a semiconductor memory device according to the first embodiment of the present invention. Referring to FIG. 1, a semiconductor memory device 1 includes an address input buffer 2 for receiving an address signal AD from an outside to generate an internal row address signal RA, a row predecoder 3 for predecoding internal row address signal RA from address input buffer 2 to generate a row predecode signal X, and a memory cell array 4.

Memory cell array 4 includes a plurality of memory cells (not shown) arranged in a matrix of rows and columns, a sub-word line SWL provided to a respective row of memory cells and having memory cells of a corresponding row connected thereto, and a main word line ZMWL provided corresponding to a prescribed number of sub-word lines.

The semiconductor memory device further includes a main word line selecting circuit 5 for decoding prescribed signals of predecode signals X from row predecoder 3 to drive an addressed main word line to the selected state, and a sub-word line select signal generating circuit 6 for generating complementary sub-decode signals (word line select signals) SD and ZSD via separate paths.

Sub-word line select signal generating circuit 6 includes an SD generating circuit 6b for generating a sub-decode signal (word line designating signal) SD and a ZSD generating circuit 6a for generating a complementary sub-decode signal (a complementary word line designating signal) ZSD, which are separately provided. Word line select signals (sub-decode signals) SD and ZSD from sub-word line select signal generating circuit 6 are applied to a sub-word line driver SWD provided on a sub-word line SWL.

Semiconductor memory device 1 further includes an internal power-supply voltage generating circuit 7 receiving an external power-supply voltage VEX to generate array power-supply voltage Vdda and peripheral power-supply voltage Vddp, and a high voltage generating circuit 8 for generating high voltage Vpp from external power-supply voltage VEX. Internal power-supply voltage generating circuit 7 is provided for each of array power-supply voltage Vdda and peripheral power-supply voltage Vddp, and includes an array down-converting circuit and a peripheral down-converting circuit for internally down-converting external power-supply voltage VEX. High voltage generating circuit 8 includes a charge-pump circuit for generating high voltage Vpp through use of charge-pumping operation of a capacitor.

Peripheral power-supply voltage Vddp is applied as one operating power-supply voltage to address input buffer 2 and row predecoder 3 which form peripheral circuitry. Peripheral power-supply voltage Vddp and high voltage Vpp are applied to main word line selecting circuit 5. High voltage Vpp, array power-supply voltage Vdda, and peripheral power-supply voltage Vddp are applied to sub-word line select signal generating circuit 6. Array power-supply voltage Vdda is applied to memory array 4 as an operating power-supply voltage for a sense amplifier circuit, not shown.

As shown in FIG. 1, in sub-word line select signal generating circuit 6, sub-decode signals SD and ZSD are generated via separate paths (i.e. circuits of different operating power-supply voltage sources so that the voltage level of sub-decode signal SD is prevented from affecting its complementary sub-decode signal ZSD, and the generation of through currents in a sub-word line driver SWD can be prevented. In other words, peripheral power-supply voltage Vddp and array power-supply voltage Vdda, except high voltage Vpp, are used to generate the complementary sub-decode signal ZSD in ZSD generating circuit 6a.

Figure 2:
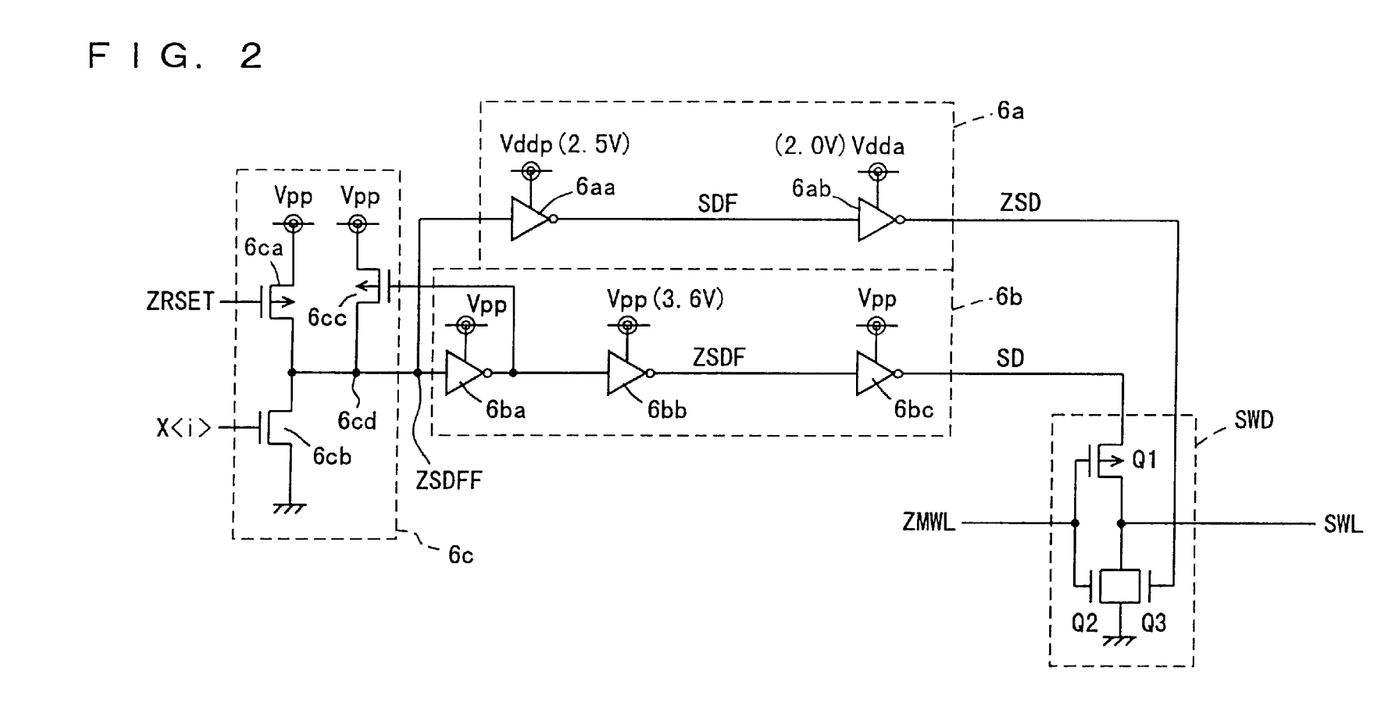
FIG. 2 is a diagram representing a configuration of a sub-word line select signal generating circuit shown in FIG. 1.

FIG. 2 is a diagram representing a configuration of a word line select signal generating circuit 6 shown in FIG. 1. Referring to FIG. 2, the word line select signal generating circuit includes a decode circuit 6c for generating a decode signal ZSDFF according to a predecode signal X<i> from row predecoder 3 shown in FIG. 1. ZSD generating circuit 6a and SD generating circuit 6b shown in FIG. 1 generate sub-decode signals ZSD and SD via separate paths according to decode signal ZSDFF output from decode circuit 6c.

Decode circuit 6c includes a P-channel MOS transistor 6ca connected between an external power-supply node and a node 6cd and receiving a reset signal ZRSET at a gate, an N-channel MOS transistor 6cb connected between node 6cd and a ground node and receiving predecode signal X<i> at a gate thereof, and a P-channel MOS transistor 6cc for preventing node 6cd from electrically floating. P-channel MOS transistor 6cc is rendered conductive when decode signal ZSDFF is at high voltage Vpp level, to hold node 6cd at the voltage Vpp level.

ZSD generating circuit 6a includes an inverter 6aa that receives a peripheral power-supply voltage Vddp, for example, of 2.5V as one operating power-supply voltage for inverting decode signal ZSDFF, and an inverter 6ab that receives array power-supply voltage Vdda, for example, of 2.0V as one operating power-supply voltage for inverting a sub-decode first signal SDF from inverter 6aa to generate a complementary sub-decode signal ZSD.

SD generating circuit 6b includes an inverter 6ba that receives a high voltage Vpp, for example, of 3.6V as one operating power-supply voltage for inverting decode signal ZSDFF, an inverter 6bb that receives the high voltage Vpp as one operating power-supply voltage for inverting an output signal of inverter 6ba, and an inverter 6bc that receives high voltage Vpp as one operating power-supply voltage for inverting a complementary sub-decode fast signal ZSDF output from inverter 6bb to generate a sub-decode signal SD.

Sub-word line driver SWD includes a P-channel MOS transistor Q1 rendered conductive, when the signal potential on main word line ZMWL is at the ground voltage level of the "L" level, for transmitting sub-decode signal SD onto sub-word line SWL, an N-channel MOS transistor Q2 rendered conductive, when the signal potential of main word line ZMWL is at high voltage Vpp level of the "H" level, for discharging sub-word line SWL to the ground voltage level, and an N-channel MOS transistor Q3 rendered conductive, when complementary sub-decode signal ZSD is at the "H" level (array power-supply voltage level), for discharging sub-word line SWL to the ground voltage level. Now, an operation of the sub-word line select signal generating circuit shown in FIG. 2 will be described with reference to a signal waveform diagram shown in FIG. 3.

Figure 3:
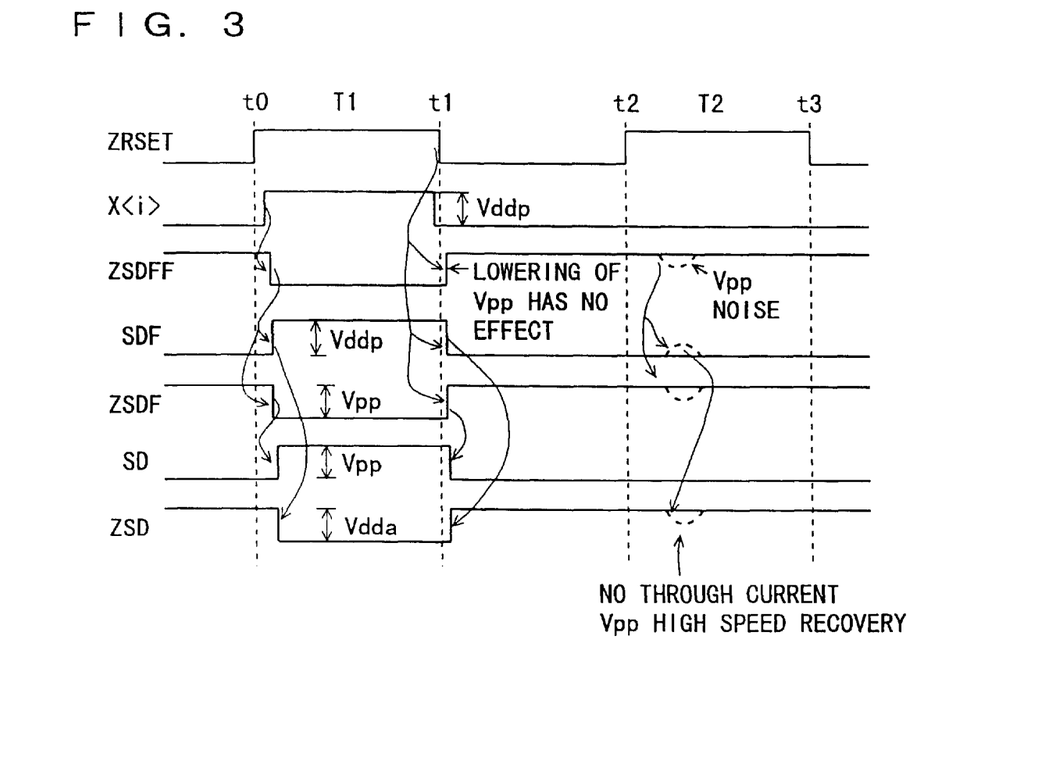
FIG. 3 is a timing chart representing an operation of the sub-word line select signal generating circuit shown in FIG. 2.

When an active cycle (memory cell select cycle) begins, at first, reset signal ZRSET rises to the "H" level (high voltage Vpp level) at time t0, and P-channel MOS transistor 6ca in decode circuit 6c attains the off state. Then, when row predecode signal X<i> attains the "H" level of the selected state, MOS transistor 6cb attains the on state, and node 6cd is discharged to the ground voltage level. Accordingly, an output signal from inverter 6ba rises to high voltage Vpp level, and MOS transistor 6cc attains the off state. As a result, decode signal ZSDFF is held at the ground voltage level. When decode signal ZSDFF falls to the "L" level, sub-decode fast signal SDF from nverter 6aa rises to peripheral power-supply voltage Vddp level in ZSD generating circuit 6a, and thereafter, complementary signal ZSD from inverter 6ab falls from array power-supply voltage Vdda level to the ground voltage level.

In SD generating circuit 6b, complementary sub-decode fast signal ZSDF from inverter 6bb falls to the "L" level in response to the fall of decode signal ZSDFF, and sub-decode signal SD from inverter 6bc rises to high voltage Vpp level, accordingly.

When main word line ZMWL is in the selected state, sub-decode signal SD of high voltage Vpp level is transmitted onto sub-word line SWL via MOS transistor Q1. MOS transistor Q3 is in the off state owing to the complementary sub-decode signal ZSD at "L" level On the other hand, when main word line ZMWL is in the non-selected state, MOS transistor Q1 is in the off state, and sub-word line SWL is held at the ground voltage level by MOS transistor Q2.

When the active cycle (memory cell select cycle) completes, and an access operation to the semiconductor memory device completes, reset signal ZRSET falls to the "L" level at time t1, MOS transistor 6ca attains the on state, and node 6cd is charged to high voltage Vpp level. Predecode signal X<i> falls to the "L" level of the non-selected state before the rise of reset signal ZRSET so that the generation of through current in decode circuit 6c is prevented.

According to the activation ("L" level) of this reset signal ZRSET, decode signal ZSDFF rises to high voltage Vpp level, and sub-decode fast signal SDF is driven to the ground voltage level, the complementary sub-decode fast signal ZSDF is driven to high voltage Vpp level, sub-decode signal ZSD is driven to array power-supply voltage Vdda level, and sub-decode signal SD is driven to the ground voltage level. Main word line ZMWL again attains high voltage Vpp level of the non-selected state, and the selected sub-word line SWL is discharged to the ground voltage level by MOS transistors Q2 and Q3.

The next active cycle starts at time t2, and reset signal ZRSET again rises to the "H" level. At this time, if predecode signal X<i> is at the "L" level of the non-selected state, MOS transistor 6cb maintains the off state and node 6cd is retained at high voltage Vpp level. In this state, the output signal of inverter 6ba retains the ground voltage level of the "L" level to maintain. MOS transistor 6cc at the on state, and node 6cd is kept at high voltage Vpp level so that node 6cd is prevented from electrically floating. Sub-decode signals ZSD and SD retain the non-selected state at array power-supply voltage Vdda level and the ground voltage level, respectively.

In this sub-word line select signal generating circuit, if high voltage Vpp is lowered in the period T1 in FIG. 3, the voltage level of sub-decode signal SD is lowered in SD generating circuit 6b correspondingly to the voltage level of high voltage Vpp. On the other hand, decode signal ZSDFF is at the ground voltage level during period T1, and maintains the ground voltage level even when the voltage level of high voltage Vpp becomes lower. Thus, ZSD generating circuit 6a is in no way affected by the lowering of the voltage level of high voltage Vpp, and maintains the complementary sub-decode signal ZSD at the ground voltage level. Therefore, during period T1, while MOS transistor Q1 is in the on state, MOS transistors Q2 and Q3 attain the off state, and the path through which a through current flows is reliably cut off in sub-word line driver SWD. The lowering of high voltage Vpp is compensated for by high voltage generating circuit 8, and is recovered to the original level at a high speed.

If the voltage level of high voltage Vpp is lowered in the period T2 in FIG. 3, the voltage level of decode signal ZSDFF is lowered. In this state, sub-decode signal SD is at the ground voltage level. In SD generating circuit 6b, inverters 6ba–6bc all operate receiving high voltage Vpp as one operating power-supply voltage. When the voltage level of decode signal ZSDFF is lowered, the input logic threshold voltage of inverter 6ba becomes lower according to the lowering of the voltage level of high voltage Vpp so that the logic level of the output signal does not change. Thus, sub-decode signal SD can be reliably held at the ground voltage level.

In ZSD generating circuit 6a, however, when the voltage level of decode signal ZSDFF becomes lower and exceeds or approaches the input logic threshold voltage of inverter 6aa, the voltage level of sub-decode fast signal SDF rises, and the voltage level of the complementary sub-decode signal ZSD accordingly becomes lower. In this case, however, sub-decode signal SD is held at the ground voltage level, and even if MOS transistor Q3 attains the on state in sub-word line driver SWD, no through current exists that flows from inverter 6bc to the ground node via sub-word line driver SWD. Thus, even when many sub-word lines are selected at the same time in a burn-in test or the like, and even when high voltage Vpp is consumed by the word line selecting operation and its voltage level is lowered, the original voltage level of high voltage Vpp is recovered at a high speed by high voltage generating circuit 8 shown in FIG. 1. In this manner, the negative influences due to the lowering of the voltage level of high voltage Vpp is reliably prevented, and the burn-in test can be carried out with accuracy. A voltage level detection is effected in high voltage generating circuit 8 and the voltage level recovery operation is performed at a high speed.

As shown in FIG. 2, a circuit receiving high voltage Vpp as an operating power-supply voltage is employed in SD generating circuit 6b for generating sub-decode signal SD having an amplitude of high voltage Vpp, while a circuit using peripheral power-supply voltage Vddp and array power-supply voltage Vdda generates the complementary sub-decode signal ZSD having an amplitude of array power-supply voltage Vdda level. As a result, the formation of the path conducting a through current in sub-word line driver SWD due to sub-decode signals SD and ZSD both attaining the high level is reliably prevented.

Figure 4:
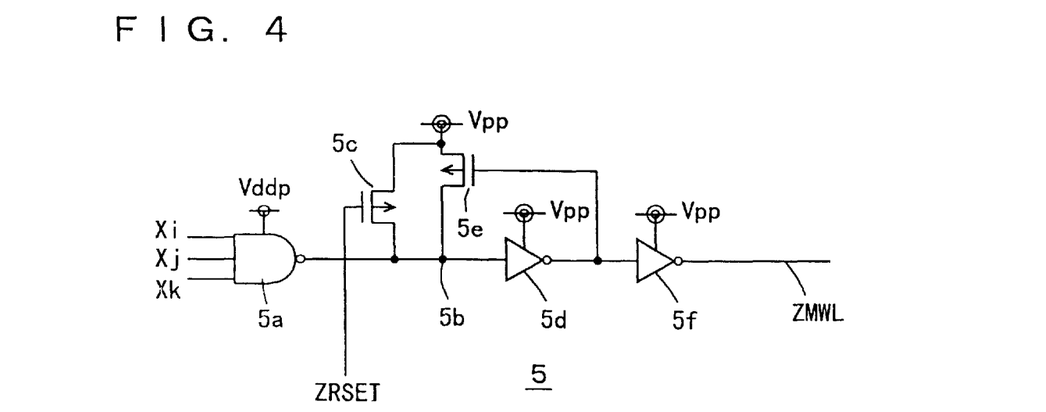
FIG. 4 is a diagram representing an example of a configuration of a main word line selecting circuit shown in FIG. 1.

FIG. 4 is a diagram representing an example of a configuration of a circuit provided for one main word line ZMWL included in main word line selecting circuit 5 shown in FIG. 1. Referring to FIG. 4, word line selecting circuit 5 includes an NAND circuit 5a receiving predecode signals Xi, Xj, and Xk from row predecoder 3 shown in FIG. 1, an inverter 5d inverting an output signal of NAND circuit 5a, a resetting P-channel MOS transistor 5c responsive to reset signal ZRSET for charging an output node 5b of NAND circuit 5a to high voltage Vpp level, an inverter 5d receiving a signal on node 5b, an inverter 5f inverting an output signal from inverter 5d to transmit the inverted output signal onto main word line ZMWL, and a charging P-channel MOS transistor 5e for charging an input node 5b of inverter 5d to high voltage Vpp level.

NAND circuit 5a receives peripheral power-supply voltage Vddp as one operating power-supply voltage, and inverters 5d and 5f receive high voltage Vpp as one operating power-supply voltage. NAND circuit 5a outputs an "L" level signal when predecode signals Xi, Xj, Xk (each is one of complementary signals) attain a predetermined combination of logic states. When the output signal of NAND circuit 5a is at the "L" level, the output signal of inverter 5d attains the "H" level, and the output signal from inverter 5f falls accordingly. Charging P-channel MOS transistor 5e is rendered non-conductive according to the rise of the output signal from inverter 5d. Main word line ZMWL in the selected state attains the ground voltage level of the "L" level.

When the output signal of NAND circuit 5a is at the "H" level, the output signal of inverter 5d attains the "L" level, and the output signal of inverter 5f accordingly attains high voltage Vpp level. At this time, MOS transistor 5e is rendered conductive and charges node 5b to high voltage Vpp level, and an input of inverter 5f is held at the ground voltage level by inverter 5d.

Meanwhile, other configurations of a main word line driver for driving main world line ZMWL may be employed.

Modification

Figure 5:
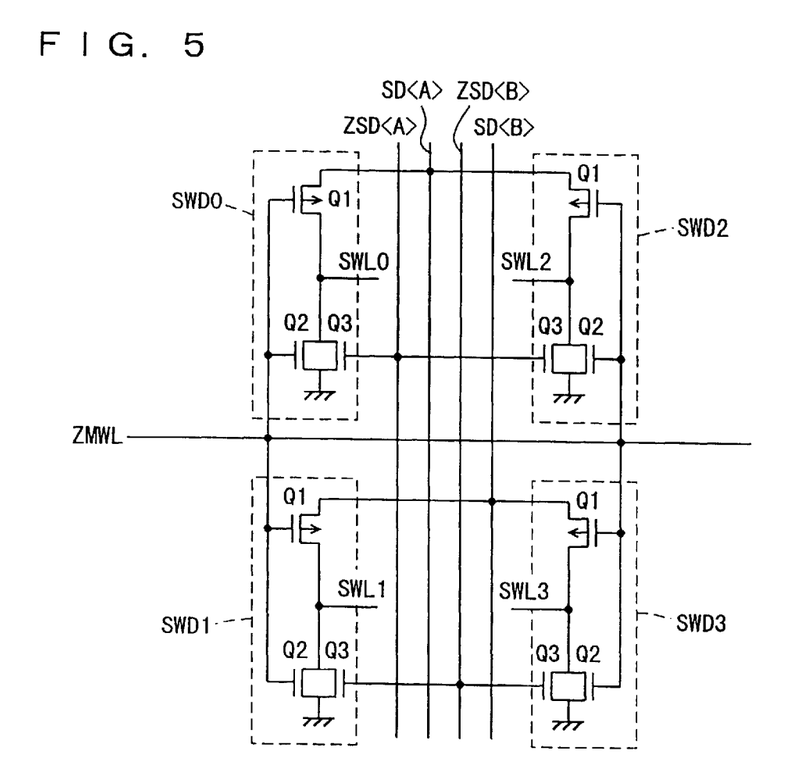
FIG. 5 is a diagram representing a modification of a sub-word line decode circuit portion.

FIG. 5 is a diagram representing a configuration of a modification of the first embodiment of the present invention. In FIG. 5, four sub-word lines SWL0 to SWL3 are provided to a main word line ZMWL. Sub-word line drivers SWD0 to SWD3 are provided corresponding to the respective sub-word lines SWL0 to SWL3. Sub-decode signals ZSD<A> and SD<A> are applied to sub-word line drivers SWD0 and SWD2, and sub-decode signals ZSD<B> and SD<B> are applied to sub-word line drivers SWD1 and SWD3. Each of sub-word line drivers SWD0 to SWD3 has the same configuration as sub-word line driver SWD previously shown in FIG. 2, and includes a P-channel MOS transistor Q1 for driving a corresponding one of sub-word lines SWL0 to SWL3 to the selected state, and N-channel MOS transistors Q2 and Q3 for maintaining the corresponding one of sub-word lines SWL0 to SWL3 in the non-selected state.

Figure 6:
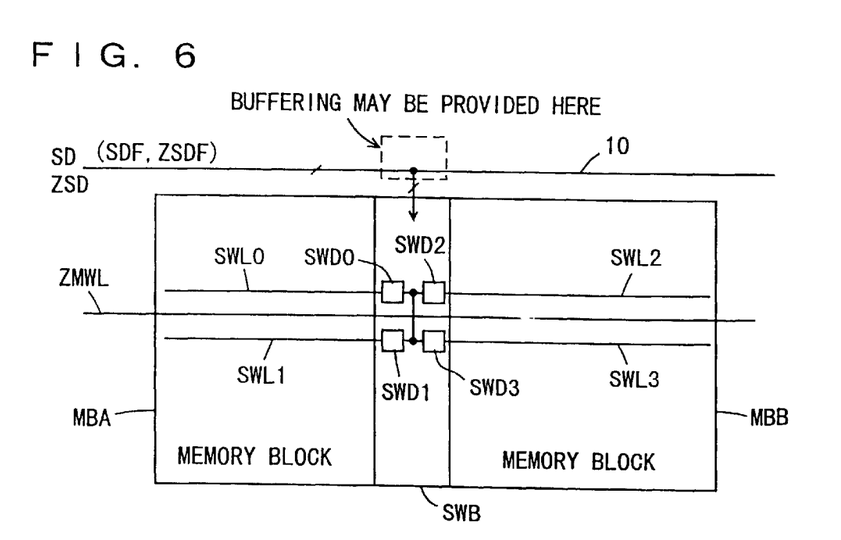
FIG. 6 is a schematic representation of an arrangement of a memory array corresponding to a sub-word line drive circuit shown in FIG. 5.

FIG. 6 is a schematic representation of a configuration of a memory array utilizing a sub-word line driver shown in FIG. 5. Referring to FIG. 6, a sub-word line driver band SWB is arranged between memory blocks MBA and MBB. A sub-decode signal transmission line 10 is provided along memory blocks MBA and MBB, for instance in the sense amplifier band. Sub-decode signals SD (SD<A> and SD<B>) and ZSD (ZSD<A> and ZSD<B>) on the sub-decode signal transmission line are transmitted to a sub-word line driver in a corresponding sub-word line driver band SWB by an interconnection line that extends along the column direction into sub-word line driver band SWB.

As will be described in detail later, a memory array is normally divided into a plurality of row blocks, and in each row block a plurality of memory blocks are arranged in alignment in the row direction. In the arrangement of the sub-word line driver shown in FIG. 5, one of the set of sub-word line drivers SWD0 and SWD2 and the set of sub-word line drivers SWD1 and SWD3 is driven to the selected state according to sub-decode signals SD and ZSD, and sub-word lines SWL0 and SWL2 or sub-word lines SWL1 and SWL3 are driven to the selected state (when main word line ZMWL is in the selected state).

In the configuration shown in FIGS. 5 and 6, the number of interconnection lines can be reduced when decode signal lines are provided in each sub-word line driver band SWB. Moreover, when a set of four sub-word line drivers is arranged alternately by providing sub-word line drivers alternately on either side of a memory block, the pitch condition of the sub-word line drivers in the column direction can be mitigated so that sub-word line drivers can be disposed with enough margin.

Further, signals SD and ZSD may be generated from signals SDF, ZSDF by the inverters (6ab, 6bc) in sub-word line driver band SWB in FIG. 6.

Figure 7:
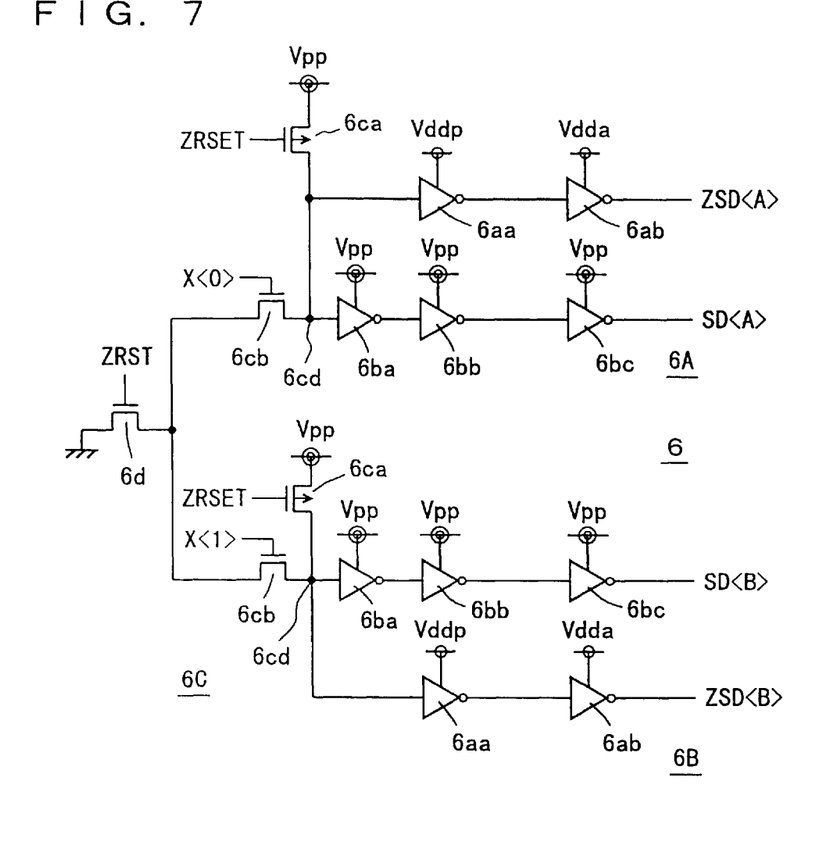
FIG. 7 is a diagram representing a configuration of a sub-word line select signal generating circuit according to a modification of a first embodiment of the present invention.

FIG. 7 is a diagram representing a configuration of sub-word line select signal generating circuit 6 for generating a sub-decode signal shown in FIG. 5. Sub-word line select signal generating circuit 6 includes a sub-word line select signal generating circuit 6A provided for sub-decode signals SD<A> and ZSD<A>, and a sub-word line select signal generating circuit 6B provided for sub-decode signals ZSD<B> and SD<B>. The configurations of sub-word line select signal generating circuits 6A and 6B are the same as the configuration of the sub-word line select signal generating circuit shown in FIG. 2. The same reference characters are used to denote the corresponding portions, and the detailed descriptions thereof will not be repeated.

In decode circuit 6c, MOS transistor 6cb receives a predecode signal X<0> decoding in sub-word line select signal generating circuit 6A, and receives predecode signal X<1> in sub-word line select signal generating circuit 6B. These predecode signals X<0> and X<1> are generated by decoding a row address signal bit RA0 (when a main word line is provided for two sub-word lines in each block).

For decoding MOS transistor 6cb, a decode-enabling MOS transistor 6d that couples a source of MOS transistor 6cb to a ground node is provided. Reset signal ZRST is a signal of the same phase as reset signal ZRSET. The amplitude of reset signal ZRST, however, is at peripheral power-supply voltage Vddp level.

Moreover, a latching MOS transistor 6cc that is used to prevent an input portion of inverter 6ba from electrically floating is not shown in FIG. 7 for simplicity.

As shown in FIG. 7, sub-word line select signal generating circuits 6A and 6B are individually provided for the respective sub-decode signal pairs. Complementary sub-decode signals are formed via separate paths in sub-word line select signal generating circuits 6A and 6B. Therefore, for each of the pairs of the complementary sub-decode signals, the rising of the voltage level in the complementary signal pair to the high level is reliably prevented, and the generation of a through current is prevented in a sub-word line decoder provided for a sub-word line in the selected state even when high voltage Vpp is lowered.

Figure 8:
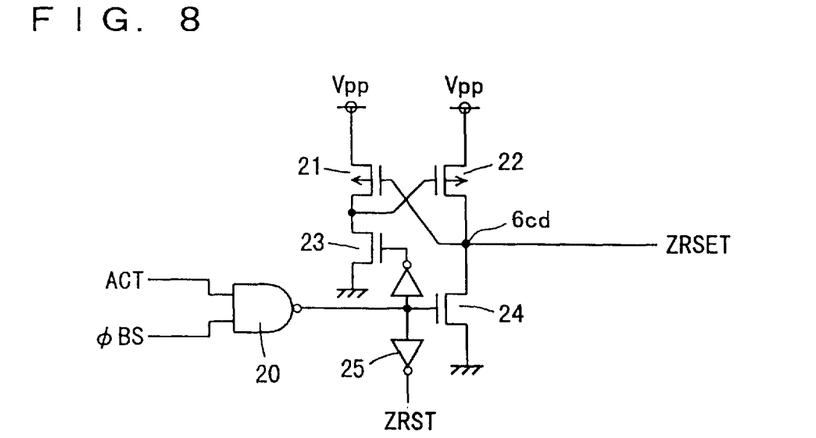
FIG. 8 is a diagram representing an example of a configuration of a portion for generating a reset signal shown in FIG. 7.

FIG. 8 is a diagram representing an example of a configuration of a reset signal generating portion. Referring to FIG. 8, the reset signal generating portion includes a NAND circuit 20 for receiving an array activation instruction signal ACT and a memory row block designating signal φBS, an N-channel MOS transistor 24 rendered conductive, when a signal from NAND circuit 20 is at the "H" level, to drive reset signal ZRSET to the ground voltage level, N-channel MOS transistors 21 and 22 coupled to a high voltage Vpp supply node, and a MOS transistor 23 receiving, at a gate thereof, an output signal from NAND circuit 20 via an inverter and for driving the gate voltage of MOS transistor 22 to the ground voltage level. MOS transistor 21 has a gate connected to a node 6cd. Reset signal ZRST is generated by an inverter 25 that receives an output signal of NAND circuit 20.

NAND circuit 20 and inverter 25 operate receiving peripheral power-supply voltage Vddp as one operating power-supply voltage. Array activation instruction signal ACT is activated when the operation of selecting a row in a memory array is performed. Block designating signal φBS designates a row block including a selected row in a configuration in which the memory array is divided into a plurality of row blocks.

In the non-selected row block, block designating signal φBS is at the "L" level, and the output signal from NAND circuit 20 attains the "H" level. Accordingly, reset signal ZRSET attains the "L" level, and a resetting MOS transistor 6ca attains the on state (see FIG. 7). In addition, reset signal ZRST attains the "L" level, and MOS transistor 6d shown in FIG. 7 retains the off state. Therefore, when predecode signals X<0> and X<1> are applied in the non-selected row block as shown in FIG. 7, no decode operation is performed since MOS transistor 6d is in the off state. The sub-decode signals retain the non-selected state in the non-selected row block.

When array activation instruction signal ACT and memory row block designating signal φBS both attain the activated state of the "H" level, the output signal from NAND circuit 20 attains the "L" level. Consequently, reset signals ZRSET and ZRST attain the "H" level, and MOS transistor 6d shown in FIG. 7 attains the on state while MOS transistor 6ca attains the off state, and the decode operation is performed on predecode signals X<0> and X<1>.

Figure 9:
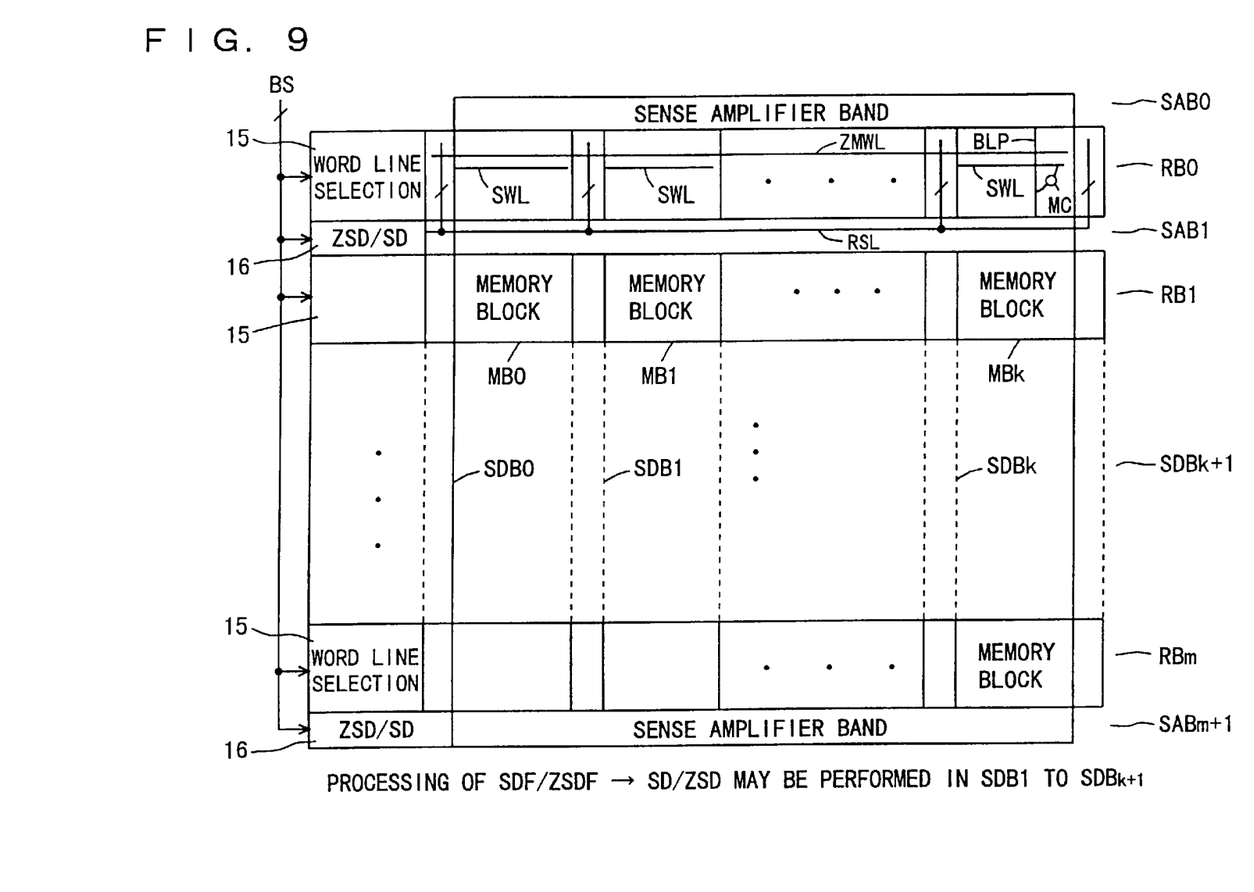
FIG. 9 is a diagram showing in greater detail a configuration of an array portion of a semiconductor memory device according to the present inventions.

FIG. 9 is a diagram showing an array configuration of the semiconductor memory device according to the present invention in greater detail. Referring to FIG. 9, a memory array is divided into a plurality of row blocks RB0 to RBm. Each of row blocks RB0 to RBm includes memory blocks MB0 to MBk aligned in the row direction. In each of memory blocks MB0 to MBk, sub-word lines SWL and bit line pairs BLP are disposed. A memory cell MC is disposed corresponding to an intersection of bit line pair BLP and sub-word line SWL.

Sense amplifier bands SAB0 to SABm+1 are arranged between the row blocks as well as on outer sides of the row blocks. These sense amplifier bands SAB0 to SABm+1 include sense amplifier circuits provided corresponding to column (bit line pair BLP) of a memory block of a corresponding row block, and perform the sensing, amplification, and latching operations of selected memory cell data. Sense amplifier bands SAB0 to SABm (not shown) each are shared between the row blocks that are adjacent to one another in the column direction.

In each of row blocks RB0 to RBm, sub-word line driver bands SDB0 to SDBk are disposed between the memory blocks adjacent to one another in the row direction and the outsides of the memory blocks MB0–MBk. A sub-word line driver is provided for a sub-word line SWL in a memory block in each of sub-word line driver bands SDB0 to SDBk. In each of row blocks RB0 to RBm, a main word line ZMWL is arranged extending in the row direction. Sub-word line SWL is disposed only within a memory block, and is connected to a corresponding memory cell within the corresponding memory block. A sub-word line is selectively driven to the selected state by a corresponding main word line ZMWL and a sub-word line driver in a corresponding sub-word line driver band.

A word line selecting circuit 15 is provided corresponding to each of row blocks RB0 to RBm. A sub-word line decoder ZSD/SD) for generating sub-decode signals SD and ZSD and for transmitting the generated signals on a sub-word line select signal line RSL is corresponding to sense amplifier bands SAB1 to SABm (not shown). A word line designating signal on a sub-word line select signal line RSL is provided to a sub-word line drivers within in a sub-word line driver band the corresponding row block. A block select signal BS is applied to word line selecting circuit 15 and sub-word line selecting circuit (ZSD/SD) 16. A block designating signal φBS shown in FIG. 8 is generated based on this block select signal BS. A word line (a main word line and a sub word line) is driven to the selected state only within a selected row block.

Thus, even with such array structure divided into memory row blocks as shown in FIG. 9, the row select operation can be performed for a selected row block by utilizing a decode circuit as the one shown in FIG. 8.

Furthermore, in the intersection of sub-word line driver bands SDB0 to SDBRT1 and sense amplifier bands SAB0 to SABm+1, inverters 6ab and 6bc shown in FIG. 7 may be provided for buffering signal SDF and ZSDF to generate sub-decode signals SD and ZSD.

Second Modification

Figure 10:
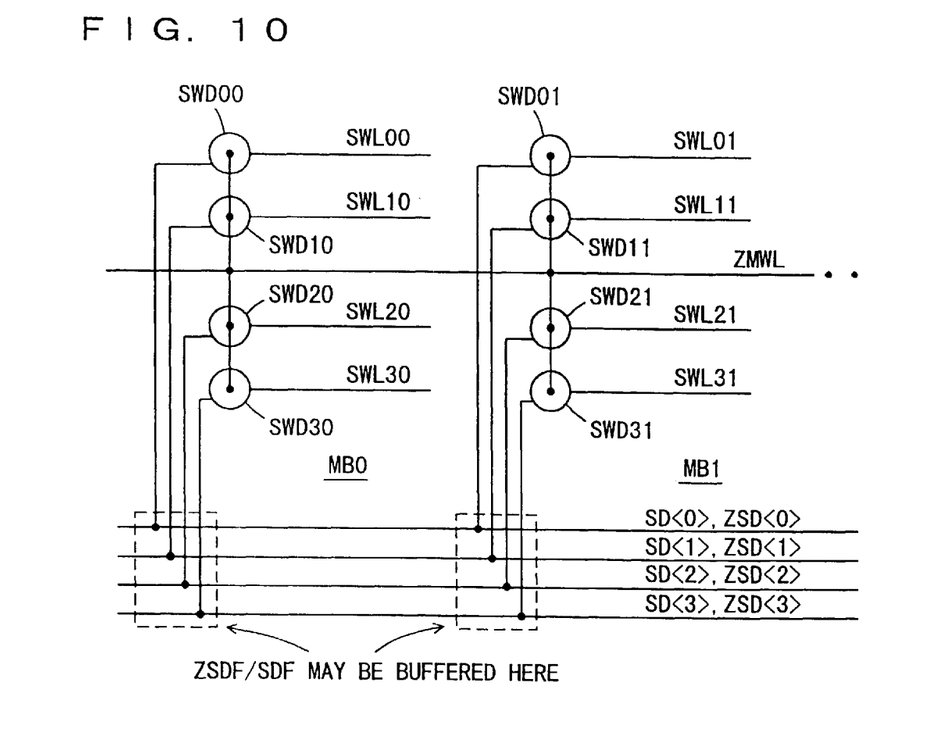
FIG. 10 is a schematic representation of a configuration of a second modification of the first embodiment of the present invention.

FIG. 10 is a schematic representation of a configuration of a second modification of the first embodiment of the present invention. As shown in FIG. 10, four sub-word lines are disposed for a main word line ZMWL in each memory block. Therefore, in memory block MB0, sub-word lines SWL00 to SWL30 are disposed for main word line ZMWL, while in memory block MB1, sub-word lines SWL01 to SWL31 are disposed. Sub-word line drivers SWD00 to SWD30 and SWD01 to SWD31 are provided corresponding to these sub-word lines SWL00 to SWL30 and SWL01 to SWL31.

Sub-decode signals SD<0> and ZSD<0> are applied to sub-word line drivers SWD00 to SWD10. Sub-word line drivers SWD10 and SWD11 receive sub-decode signals SD<1> and ZSD<1>. Sub-decode signals SD<2> and ZSD<2> are applied to sub-word line drivers SWD20 and SWD21. Sub-decode signals SD<3> and ZSD<3> are applied to sub-word line drivers SWD30 and SWD31.

Even with such a configuration in which four sub-word lines are provided to one main word line in each memory block, leakage current within a sub-word line driver can be reliably reduced by generating the sub-decode signals via separate paths according to the predecode signals in each of the sub-decode signal line pair. In addition, sub-decode signals are generated from predecode signals X<0> to X<3>. Predecode signals X<0> to X<3> of 4 bits are generated by decoding two bits RX0 and RX1 of row address.

Further, in the configuration shown in FIG. 10, sub-decode fast signals SDF and ZSDF may be transmitted along a sense amplifier band, and sub-decode signals SD and ZSD may be generated by an inverter buffer in a sub-word line driver band.

As described above, according to the first embodiment of the present invention, the complementary sub-decode signals to be applied to a sub-word line driver are generated via separate paths so that the complementary sub-decode signals can be prevented from attaining the high level at the same time, and the generation of a through current in the sub-word line driver can be prevented.

Other Applications

The present invention is applicable to any configuration in which a word line has a divided structure of main/sub-word lines and in which complementary decode signals are employed to select a sub-word line driver.

As described above, according to the present invention, the complementary sub-decode signals for driving a sub-word line driver are generated via separate paths using circuits that utilize individual power-supply voltages as operating power-supply voltages. As a result, the generation of a through current in the sub-word line driver can be prevented, the consumed current can be kept small, and the voltage level of the selected word line can be held stably at a prescribed voltage level. Thus, the voltage stress acceleration such as a burn-in test can be performed with accuracy.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
a plurality of memory cells arranged in rows and columns; and
a plurality of sub-word lines provided corresponding to the rows of memory cells and having the memory cells of corresponding rows connected thereto, said plurality of sub-word lines divided into a plurality of blocks along a row direction and divided into groups by a prescribed number along a column direction;
a plurality of main word lines provided in common to said plurality of blocks, extending in the row direction and corresponding to the respective groups of the sub-word lines;
a main word line selecting circuit for driving an addressed main word line to a selected state according to a first address bit of a multi-bit address signal;
a sub-decode circuit for generating complementary decode fast signals for designating a sub-word line within each group of said sub-word lines according to the multi-bit address signal excluding said first address bit;
a sub-word line selecting circuit for generating complementary sub-word line select signals individually according to respective complementary decode fast signals from said sub-decode circuit, said complementary sub-word line select signals formed via separate paths; and
a plurality of sub-word line drive circuits provided corresponding to the sub-word lines for driving corresponding sub-word lines to a selected state according to signals on corresponding main word lines and said complementary sub-word line select signals.

2. The semiconductor memory device according to claim 1, wherein said main word line selecting circuit drives said addressed main word line to a first power-supply voltage level, and holds a main word line in a non-selected state at a second power-supply voltage level, and
said complementary decode fast signals include a first decode fast signal having an amplitude of said second power-supply voltage level and a second decode fast signal having an amplitude of a third voltage level that is between said first power-supply voltage level and said second power-supply voltage level.

3. The semiconductor memory device according to claim 2, wherein said sub-word line selecting circuit includes
a circuit receiving said second power-supply voltage as one operating power-supply voltage and for generating a first sub-word line select signal according to said first decode fast signal, and
a circuit receiving a voltage not less than said third voltage as one operating power-supply voltage and for generating a second sub-word line select signal according to said second decode fast signal.

4. The semiconductor memory device according to claim 1, wherein said sub-decode circuit includes a circuit for generating a pair of decode signals complementary to one another for each of a prescribed number of sub-word line drive circuits in each group of said plurality of sub-word lines and for outputting said pair of decode signals as the decode fast signals, and
said sub-word line selecting circuit includes circuits provided for the respective decode fast signals complementary to one another of the pair, and for individually receiving a corresponding pair of complementary decode fast signals to generate a pair of complementary sub-word line output signals for outputting as said sub-word line select signals.

5. A semiconductor memory device, comprising:

a sub word line connecting to memory cells arranged on a row;

a main word line arranged corresponding to said sub word line;

a predecoder receiving an address signal and predecoding the address signal to produce first and second predecode signals;

a word decoder receiving and decoding the first predecode signal to produce a sub word decode signal;

a first sub decoder coupled to said word decoder and producing a first sub decode signal in response to said sub word decode signal, said first sub decoder receiving a first operating power supply voltage from a first power source for operation;

a second sub decoder coupled to said word decoder and producing a second sub decode signal in response to said sub word decode signal, the second sub decoder receiving a second power supply voltage from a second power supply source different from said first power source for operation;

a row decoder receiving and decoding the second predecode signal to produce a main word line selecting signal onto said main word line; and a sub word driver coupled to said main word line and the first and second sub decoder, for driving said sub word line to a selected state in accordance with the first and second sub decode signals and the main word line selecting signal.

6. The semiconductor memory device according to claim 5, wherein the first and second power sources are independent of each other and generate the first and second power supply voltages at different levels.

7. The semiconductor memory device according to claim 5, where the sub word line is arranged in plurality alignedly in a row direction, and the main word line is provided commonly to the sub word lines arranged in plurality, and the first and second sub decoders are provided in common to the sub word lines arranged in plurality.

8. The semiconductor memory device according to claim 5, wherein the sub word line is arranged in plurality aligned in a row direction, and the sub word lines arranged in plurality are divided into groups in the row direction and the first and second sub decoders are arranged in a region between the groups adjacent in the row direction.

9. The semiconductor memory device according to claim 5, wherein the first and second sub decoders each comprise a buffer for buffering the sub word decode signal, and the first and second sub decode signals are complementary to each other.

10. The semiconductor memory device according to claim 5, wherein the first power supply voltage is one of an array power supply voltage and a peripheral power supply voltage, and the second power supply voltage is a high voltage higher than the array and peripheral power supply voltages.

11. The semiconductor memory device according to claim 5, wherein the first sub decoder includes a first buffer using a peripheral power supply voltage as an operating power supply voltage for buffering the sub word decode signal, and a second buffer using an array power supply voltage as an operating power supply voltage for buffering an output of said first buffer, and said second sub decoder includes a third buffer using a high voltage higher than the peripheral and array power supply voltages for buffering the sub word decode signal.

* * * * *